US011783905B2

(12) United States Patent
Lee et al.

(10) Patent No.: US 11,783,905 B2
(45) Date of Patent: Oct. 10, 2023

(54) ANTI-FUSE MEMORY DEVICE, MEMORY ARRAY, AND PROGRAMMING METHOD OF AN ANTI-FUSE MEMORY DEVICE FOR PREVENTING LEAKAGE CURRENT AND PROGRAM DISTURBANCE

(71) Applicant: eMemory Technology Inc., Hsin-Chu (TW)

(72) Inventors: Chieh-Tse Lee, Hsinchu County (TW); Ting-Yang Yen, Hsinchu County (TW); Cheng-Da Huang, Hsinchu County (TW); Chun-Hung Lin, Hsinchu County (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 17/469,828

(22) Filed: Sep. 8, 2021

(65) Prior Publication Data
US 2022/0199178 A1   Jun. 23, 2022

Related U.S. Application Data

(60) Provisional application No. 63/127,165, filed on Dec. 18, 2020.

(51) Int. Cl.
*G11C 17/18*   (2006.01)
*G11C 17/16*   (2006.01)

(52) U.S. Cl.
CPC ............. *G11C 17/18* (2013.01); *G11C 17/16* (2013.01)

(58) Field of Classification Search
CPC ................................ G11C 17/18; G11C 17/16
USPC ............................................................ 365/96
See application file for complete search history.

(56) References Cited

U.S. PATENT DOCUMENTS

| 9,824,727 | B2 | 11/2017 | Huang | |
|---|---|---|---|---|
| 10,529,436 | B1 | 1/2020 | Sargsyan | |
| 10,685,724 | B2 | 6/2020 | Chen | |
| 2016/0141049 | A1 | 5/2016 | Song | |
| 2017/0040067 | A1* | 2/2017 | Byun | G11C 17/16 |
| 2017/0053707 | A1* | 2/2017 | Liao | G11C 17/18 |
| 2017/0076757 | A1* | 3/2017 | Wu | H10B 20/20 |
| 2017/0186756 | A1 | 6/2017 | Choi | |
| 2020/0051651 | A1 | 2/2020 | Hoang | |

FOREIGN PATENT DOCUMENTS

TW   201735047 A   10/2017

* cited by examiner

*Primary Examiner* — Huan Hoang
(74) *Attorney, Agent, or Firm* — Winston Hsu (57) ABSTRACT

When a driving circuit of an anti-fuse memory device programs a selected anti-fuse memory cell, voltage differences between unselected bit lines and unselected anti-fuse control lines would be eliminated or decreased to an acceptable value by floating unselected anti-fuse control lines or by applying a second control line voltage to the unselected anti-fuse control lines. Leakage currents flowing from unselected bit lines through ruptured anti-fuse transistors of the anti-fuse memory device to the unselected anti-fuse control lines would be decreased or eliminated, and program disturbance would be avoided.

20 Claims, 4 Drawing Sheets

ANTI-FUSE MEMORY DEVICE, MEMORY ARRAY, AND PROGRAMMING METHOD OF AN ANTI-FUSE MEMORY DEVICE FOR PREVENTING LEAKAGE CURRENT AND PROGRAM DISTURBANCE

CROSS REFERENCE TO RELATED APPLICATIONS

This non-provisional application claims the benefit of U.S. provisional application No. 63/127,165, filed on Dec. 18, 2020, the contents of which are incorporated herein in their entirety.

BACKGROUND OF THE INVENTION

1. Field of the Invention

The invention is related to an anti-fuse memory device and a control method thereof, and more particular to an anti-fuse memory device and a control method thereof for preventing leakage current and program disturbance.

2. Description of the Prior Art

Non-volatile memory (NVM) devices are capable of saving stored data after the power is turned off and thus have become a type of memory device widely adopted in personal computers and electronic apparatuses.

An anti-fuse memory device is a one-time programming (OTP) NVM widely applied in electronic apparatuses. By applying a voltage for the current to flow through the junction of the oxide layer, the dopant is shifted so that an oxide layer of the anti-fuse transistor is broken down (also called "ruptured") to form a conductive path. However, in the memory array formed by anti-fuse transistors, the unselected cell already been programmed may occur oxide breakdown and cause current leakage during a program operation of adjacent selected memory cell (s), which leads to an issue of program disturbance.

SUMMARY OF THE INVENTION

An embodiment of the present invention discloses an anti-fuse memory device. The anti-fuse memory device comprises a plurality of anti-fuse control lines having a first anti-fuse control line, a plurality of word lines having a first word line, a plurality of bit lines having a first bit line, and a plurality of anti-fuse memory cells. Each anti-fuse memory cell is coupled to a corresponding anti-fuse control line, a corresponding word line and a corresponding bit line. When an anti-fuse memory cell of the anti-fuse memory cells is selected during a program operation of the anti-fuse memory device, the first anti-fuse control line coupled to the selected anti-fuse memory cell is configured to receive a first control line voltage, the first word line coupled to the selected anti-fuse memory cell is configured to receive a first word line voltage, the first bit line coupled to the selected anti-fuse memory cell is configured to receive a first bit line voltage, the bit lines other than the first bit line are configured to receive a second bit line voltage higher than the first bit line voltage, and the anti-fuse control lines other than the first anti-fuse control line are floating or are configured to receive a second control line voltage higher than the first bit line voltage. The second control line voltage is equal to or less than the second bit line voltage and is higher than a ground voltage.

Another embodiment of the present invention discloses a memory array. The memory array comprises a first memory cell, a second memory cell, a third memory cell, and a fourth memory cell. When the memory array performs a program operation and the first memory cell is selected, a first control line coupled to the first memory cell and the second memory cell is configured to receive a first control line voltage, a first word line coupled to the first memory cell and the second memory cell is configured to receive a first word line voltage, a first bit line coupled to the first memory cell and the third memory cell is configured to receive a first bit line voltage, a second control line coupled to the third memory cell and the fourth memory cell is configured to be floating or receive a second control line voltage, a second word line coupled to third memory cell and the fourth memory cell is configured to receive a second word line voltage, and a second bit line coupled to the second memory cell and the fourth memory cell is configured to receive a second bit line voltage. The first control line voltage is higher than the second control line voltage, the first word line voltage is higher than the second word line voltage, and the first bit line voltage is lower than the second bit line voltage. The second control line voltage is higher than a ground voltage and is lower than or equal to the second bit line voltage.

Another embodiment of the present invention discloses programming method of an anti-fuse memory device. The anti-fuse memory device comprises a plurality of anti-fuse control lines, a plurality of word lines, a plurality of bit lines, a plurality of anti-fuse memory cells, and a driving circuit. Each anti-fuse memory cell is coupled to a corresponding anti-fuse control line, a corresponding word line and a corresponding bit line, and the driving circuit is configured to controlling operations of the anti-fuse memory cells via the anti-fuse control lines, the word lines and the bit lines. The programming method comprises: the driving circuit programming a selected anti-fuse memory cell selected from the anti-fuse memory cells by applying a first control line voltage to an anti-fuse control line coupled to the selected anti-fuse memory cell, applying a first word line voltage to a word line coupled to the selected anti-fuse memory cell, and applying a first bit line voltage to a bit line coupled to the selected anti-fuse memory cell; the driving circuit applying a second bit line voltage greater than the first bit line voltage to rest bit lines when the driving circuit programs the selected anti-fuse memory cell; and the driving circuit applying a second control line voltage to rest anti-fuse control lines or driving the rest anti-fuse control lines to a floating state when the driving circuit programs the selected anti-fuse memory cell. The second control line voltage is equal to or less than the second bit line voltage and is higher than a ground voltage.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
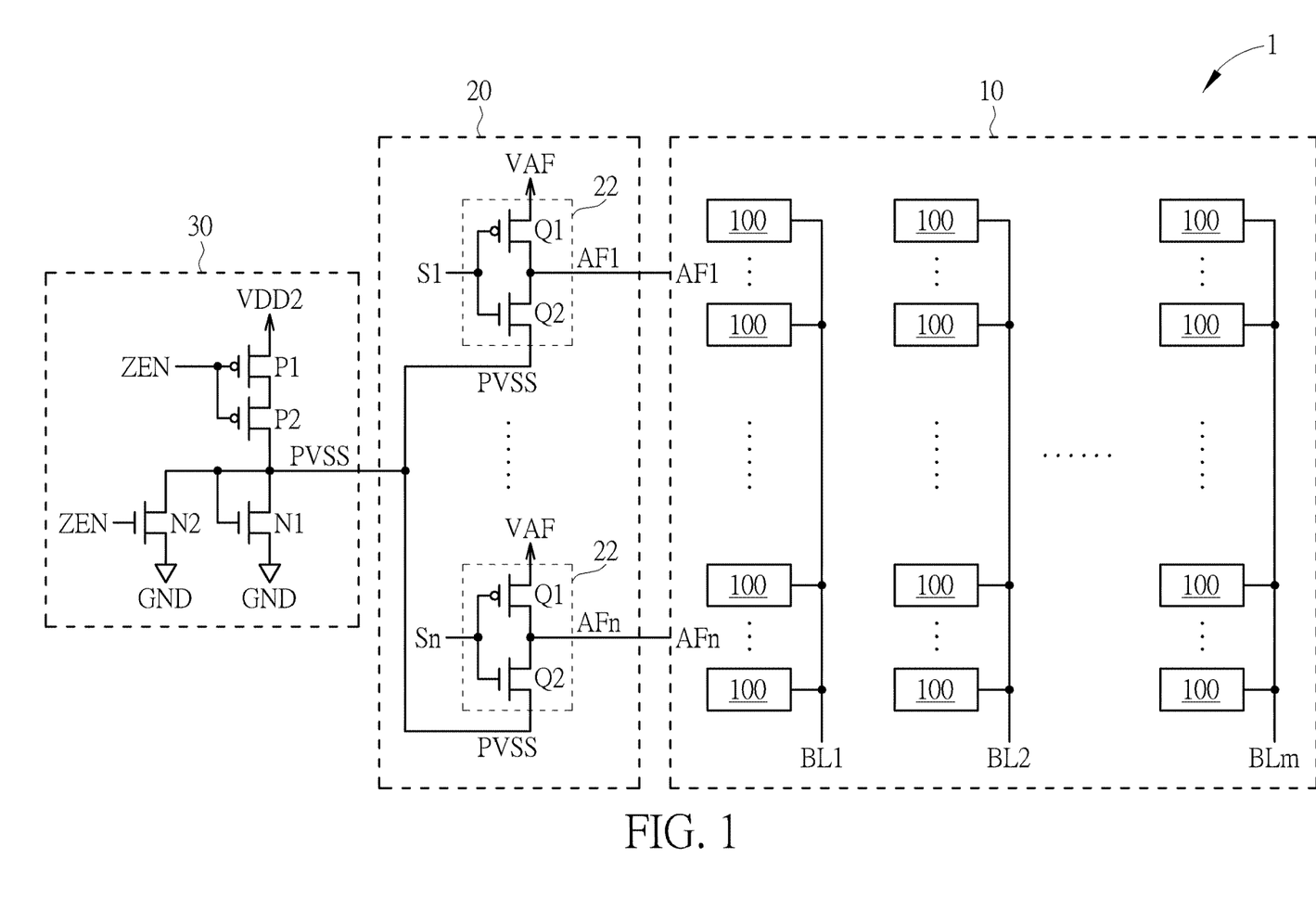
FIG. 1 shows an anti-fuse memory device according to an embodiment of the present invention.
Figure 2:
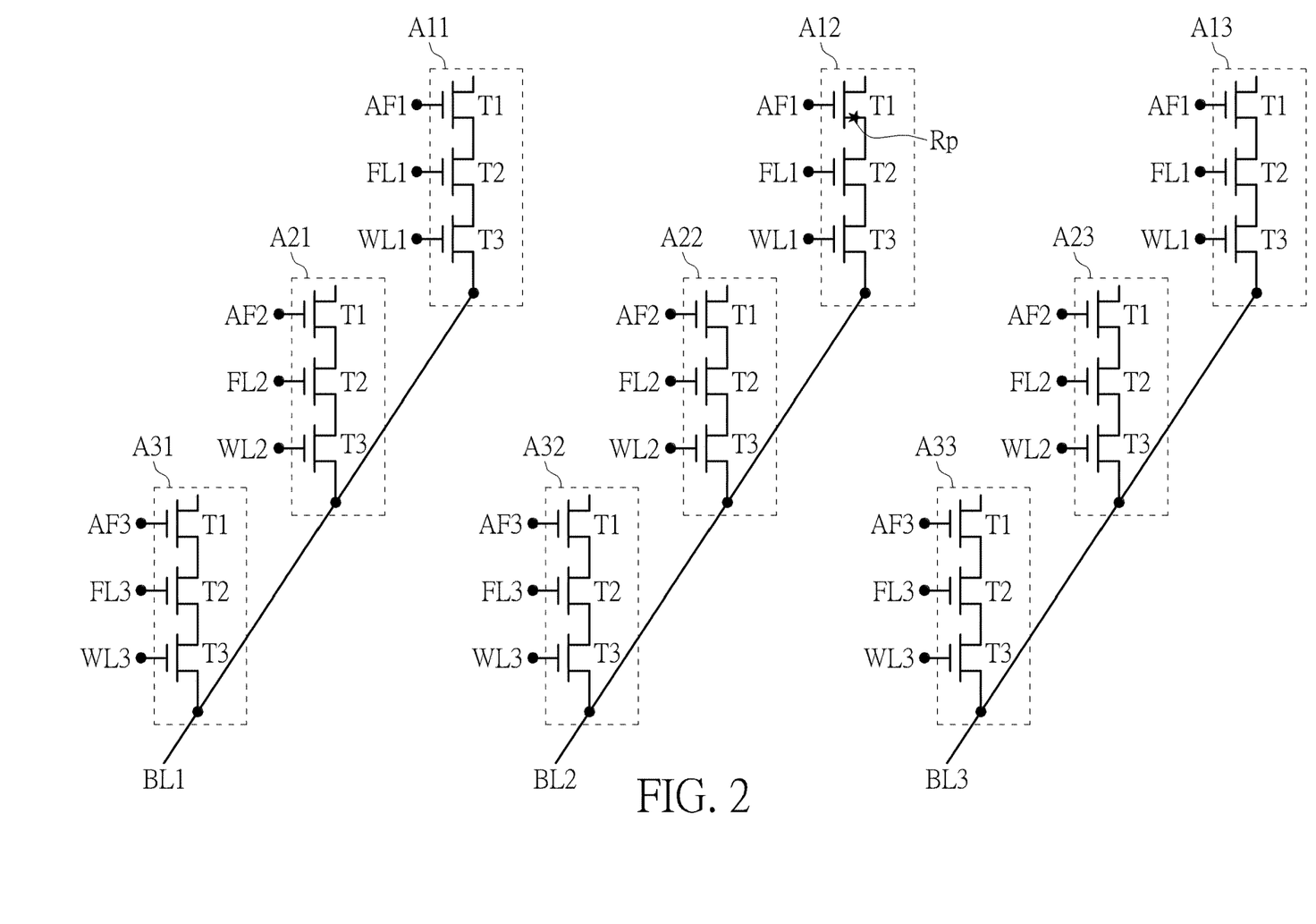
FIG. 2 shows several anti-fuse memory cells of the anti-fuse memory device in FIG. 1.

FIG. 1 shows an anti-fuse memory device 1 according to an embodiment of the present invention, and FIG. 2 shows several anti-fuse memory cells A11 to A33 of the anti-fuse memory device 1 in FIG. 1. The anti-fuse memory device 1 comprises a memory array 10 and a driving circuit 20. The memory array 10 comprises a plurality of anti-fuse control lines AF1 to AFn, a plurality of word lines (e.g., WL1 to WL3), a plurality of bit lines BL1 to BLm, and a plurality of anti-fuse memory cells 100. The anti-fuse memory cells 100 of the memory array 10 are arranged in m columns and n rows, and m and n are integers greater than 1. Each anti-fuse memory cell 100 is coupled to a corresponding anti-fuse control line, a corresponding word line and a corresponding bit line. For example, the anti-fuse memory cell A21 is coupled to the anti-fuse control line AF2, the word line WL2 and the bit line BL1. The anti-fuse memory cell A13 is coupled to the anti-fuse control line AF1, the word line WL1 and the bit line BL3. The anti-fuse memory cells A11 to A33 shown in FIG. 2 are anti-fuse memory cells exemplary selected from anti-fuse memory cells 100 of the memory array 10 shown in FIG. 1.

In an embodiment of the present invention, each of the anti-fuse memory cells 100 comprises an anti-fuse transistor T1 and a select transistor T3. The anti-fuse transistor T1 has thin oxide layer with lower breakdown voltage, and is coupled to a corresponding anti-fuse control line (e.g., AF1, AF2, or AF3). The select transistor T3 is coupled to a corresponding word line (e.g., WL1, WL2, or WL3) and a corresponding bit line (e.g., BL1, BL2, or BL3). In another embodiment, each of the anti-fuse memory cells 100 may further comprise a following gate transistor T2, which is coupled to a corresponding following gate line (e.g., FL1, FL2, or FL3) and coupled between the anti-fuse transistor T1 and the select transistor T3. In other words, the following gate transistor T2 is an optional component in some embodiments of the present invention, and the anti-fuse transistor T1 may be coupled to the select transistor T3 directly. To be noticed, the anti-fuse transistor T1 can be implemented by other types of transistor which may occur oxide breakdown or be ruptured easily.

During a program operation of the anti-fuse memory device 1, an anti-fuse memory cell is selected, and related voltages would be applied to the anti-fuse memory cells 100 via the anti-fuse control lines AF1 to AFn, the word lines (e.g., WL1 to WL3), and the bit lines BL1 to BLm. For example, when the anti-fuse memory cell A31 is selected by the driving circuit 20 to be programmed, voltages applied from the driving circuit 20 to the anti-fuse control lines AF1 to AF3, the word lines WL1 to WL3, the following gate lines FL1 to FL3, and the bit lines BL1 to BL3 could be presented in the following table 1.

TABLE 1

| AF1 (0.5 V to 1.5 V or floating) | FL1 (0 V) | WL1 (0 V) | BL1 (0 V) |
| AF2 (0.5 V to 1.5 V or floating) | FL2 (0 V) | WL2 (0 V) | BL2 (1.5 V) |
| AF3 (6 V) | FL3 (2.2 V) | WL3 (1.5 V) | BL3 (1.5 V) |

When the driving circuit 20 programs the selected anti-fuse memory cell A31, the anti-fuse control line AF3 coupled to the selected anti-fuse memory cell A31 is applied with a first control line voltage of 6 volts, the following gate line FL3 is applied with a first following gate voltage of 2.2 volts, the word line WL3 coupled to the selected anti-fuse memory cell A31 is applied with a first word line voltage of 1.5 volts, and the bit line BL1 coupled to the selected anti-fuse memory cell A31 is applied with a first bit line voltage of 0 volts. Moreover, when the driving circuit 20 programs the selected anti-fuse memory cell A31, the rest anti-fuse control lines AF1 and AF2 are floating or applied with a second control line voltage of 0.5 to 1.5 volts, the rest following gate lines FL1 and FL2 are applied with a second following gate voltage of 0 volts, the rest word lines WL1 and WL2 are applied with a second word line voltage of 0 volts, and the rest bit lines BL2 and BL3 are applied with a second bit line voltage of 1.5 volts.

In the embodiment, the first control line voltage is higher than the first following gate voltage. The first following gate voltage is higher than the first word line voltage. The second bit line voltage is higher than or substantially equal to the first word line voltage, to ensure that the transistor T3 in each of the unselected memory cells (e.g. A32 and A33) can be turned off. In the embodiment, since the second control line voltage is 0.5 to 1.5 volts, and the second bit line voltage is 1.5 volts, the second control line voltage is equal to or less than the second bit line voltage.

By following the voltage level relationship mentioned above, the voltage levels are not limited thereto.

In the embodiment, the anti-fuse memory cell A12 has been programmed. In other words, the anti-fuse transistor T1 of the anti-fuse memory cell A12 has been ruptured and has a rupture Rp with low resistance such that a leakage may flow from the bit line BL2 through the ruptured anti-fuse transistor T1 to the anti-fuse control line AF1. However, since the anti-fuse control lines AF1 is floating or applied with the second control line voltage of 0.5 to 1.5 volts when the driving circuit 20 programs the selected anti-fuse memory cell A31, a voltage difference between the bit line BL2 and the anti-fuse control line AF1 is eliminated or decreased to an acceptable value. Accordingly, a leakage current flowing from the bit line BL2 through the ruptured anti-fuse transistor T1 to the anti-fuse control line AF1 would be decreased or eliminated. Since the leakage current would be decreased or eliminated, a voltage level of the bit line BL2 would be maintained stably (e.g., the voltage level of the bit line BL2 is maintained at 1.5 volts) to keep the anti-fuse transistor T1 of the anti-fuse memory cell A32, which is adjacent to the selected anti-fuse memory cell A31 and coupled to the selected anti-fuse control line AF3, from program disturbance.

As mentioned previously, the following gate transistor T2 is an optional component in some embodiments of the present invention. For such embodiments, the foresaid table 1 may be simplified to table 2, as shown below.

TABLE 2

| AF1 (0.5 V to 1.5 V or floating) | WL1 (0 V) | BL1 (0 V) |
| AF2 (0.5 V to 1.5 V or floating) | WL2 (0 V) | BL2 (1.5 V) |
| AF3 (6 V) | WL3 (1.5 V) | BL3 (1.5 V) |

In an embodiment of the present invention, the driving circuit 20 may comprise a plurality of control units 22. Each control unit 22 is configured to output the first control line voltage (e.g., 6 volts) or the second control line voltage (e.g., 0.5 to 1.5 volts) to an anti-fuse control line (e.g., AF1, . . . , or AFn) coupled to the each control unit 22 according to a select signal (e.g., S1, . . . , or Sn). Each control unit 22 may comprise a P-type transistor Q1 and an N-type transistor Q2. The P-type transistor Q1 has a first terminal applied with the first control line voltage (i.e., VAF)

a second terminal coupled to a corresponding anti-fuse control line (e.g., AF1, . . . , or AFn), and a control terminal for receiving the select signal (e.g., S1, . . . , or Sn). The N-type transistor Q2 has a first terminal coupled to the corresponding anti-fuse control line (e.g., AF1, . . . , or AFn), a second terminal applied with the second control line voltage (i.e., PVSS), and a control terminal for receiving the select signal (e.g., S1, . . . , or Sn). The select signals S1 to Sn are used to control the control units 22. For example, when the select signal S1 is at a high voltage level, the anti-fuse control line AF1 is applied with the second control line voltage PVSS (e.g., 0.5V to 1.5V). When the select signal S1 is at a low voltage level, the anti-fuse control line AF1 is applied with the first control line voltage VAF (e.g., 6V). In an embodiment of the present invention, the anti-fuse memory device 1 may further comprise a pseudo-ground circuit 30 configured to output the second control line voltage PVSS. The pseudo-ground circuit 30 may comprise a first P-type transistor P1, a second P-type transistor P2, and a first N-type transistor N1. The first P-type transistor P1 has a first terminal coupled to a first power terminal VDD2, a second terminal, and a control terminal configured to receive an operation signal ZEN. The second P-type transistor P2 has a first terminal coupled to the second terminal of the first P-type transistor P1, a second terminal coupled to an output terminal of the pseudo-ground circuit 30, and a control terminal configured to receive the operation signal ZEN. The first N-type transistor N1 has a first terminal coupled to the output terminal of the pseudo-ground circuit 30, a second terminal coupled to a second power terminal GND, and a control terminal coupled to the output terminal of the pseudo-ground circuit 30.

The operation signal ZEN is used to control the anti-fuse memory device 1 to perform a program operation or a read operation. When the voltage level of the operation signal ZEN is at a low level, the anti-fuse memory device 1 performs a program operation, and the pseudo-ground circuit 30 outputs the second control line voltage PVSS to the driving circuit 20. When the anti-fuse memory device 1 performs the programming operation, since the second terminal of the first N-type transistor N1 is grounded and the first N-type transistor N1 is turned on, the second control line voltage PVSS outputted from the output terminal of the pseudo-ground circuit 30 may be equal to the threshold voltage (e.g., 0.5 volts) of the first N-type transistor N1.

In an embodiment of the present invention, the pseudo-ground circuit 30 may further comprise a second N-type transistor N2, which has a first terminal coupled to the output terminal of the pseudo-ground circuit 30, a second terminal coupled to the second power terminal GND, and a control terminal configured to receive the operation signal ZEN. When the anti-fuse memory device 1 performs the read operation, the voltage level of the operation signal ZEN is at a high level to turn on the second N-type transistor N2 to couple the output terminal of the pseudo-ground circuit 30 to the second power terminal GND. Therefore, the voltage level of the output terminal of the pseudo-ground circuit 30 may be 0 volts when the anti-fuse memory device 1 performs the read operation.

In some embodiments, the first N-type transistor N1 may have better/stronger driving ability (e.g. stronger than the P-type transistors P1 and P2 so as to drive the output terminal of the pseudo-ground circuit 30 to ground when the anti-fuse memory device 1 performs the program operation.

Although the structure of the pseudo-ground circuit 30 is shown in FIG. 1, the present invention is not limited to this. For example, in some other embodiments, the second P-type transistor P2 may be omitted, and the second terminal of the first P-type transistor P1 may be coupled to the output terminal of the pseudo-ground circuit 30. In some other embodiments, the first P-type transistor P1 and the second P-type transistor P2 may be connected in series or in parallel with more transistors. In some other embodiments, the first N-type transistor N1 may be connected in series or in parallel with more transistors according to desired specification. For example, when the second N-type transistor N2 is connected between the first N-type transistor N1 and the second power terminal GND, the first terminal and the control terminal of the first N-type transistor N1 are connected to the output terminal of the pseudo-ground circuit 30, the second terminal of the first N-type transistor N1 is connected to the control terminal and the first terminal of the second N-type transistor N2, and the second terminal of the second N-type transistor N2 is connected to the second power terminal GND, the second control line voltage PVSS would be equal to a sum of the threshold voltage of the first N-type transistor N1 and the threshold voltage of the second N-type transistor N2.

Due to the limitations of the cross-voltages of transistors, when the second control line voltage PVSS replaces the voltage level of the second power terminal GND (e.g., a ground voltage), the first control line voltage VAF can be applied with a greater voltage level (e.g., a voltage level greater than 6V). Accordingly, the voltage difference between the bit line and the anti-fuse control line coupled to the selected anti-fuse memory cell 100 would be increased when the anti-fuse memory device 1 performs the program operation, such that the anti-fuse memory device 1 would have a better program efficiency.

In the documents, an anti-fuse control line coupled to the selected anti-fuse memory cell may be referred to as "a selected anti-fuse control line", and the anti-fuse control lines other than the selected anti-fuse control line may be referred to as "unselected anti-fuse control lines". The above description can be applied to the following gate lines, the word lines and the bit lines by analogy. According to such definitions, when the anti-fuse memory cell A31 is selected to be programmed, the anti-fuse control line AF3 is the selected anti-fuse control line, the following gate line FL3 is the selected following gate line, the word line WL3 is the selected word line, the bit line BL1 is the selected bit line, the anti-fuse control lines AF1 and AF2 are the unselected anti-fuse control lines, the following gate lines FL1 and FL2 are the unselected following gate lines, the word lines WL1 and WL2 are the unselected word lines, and the bit lines BL2 and BL3 are the unselected bit lines.

Figure 3:
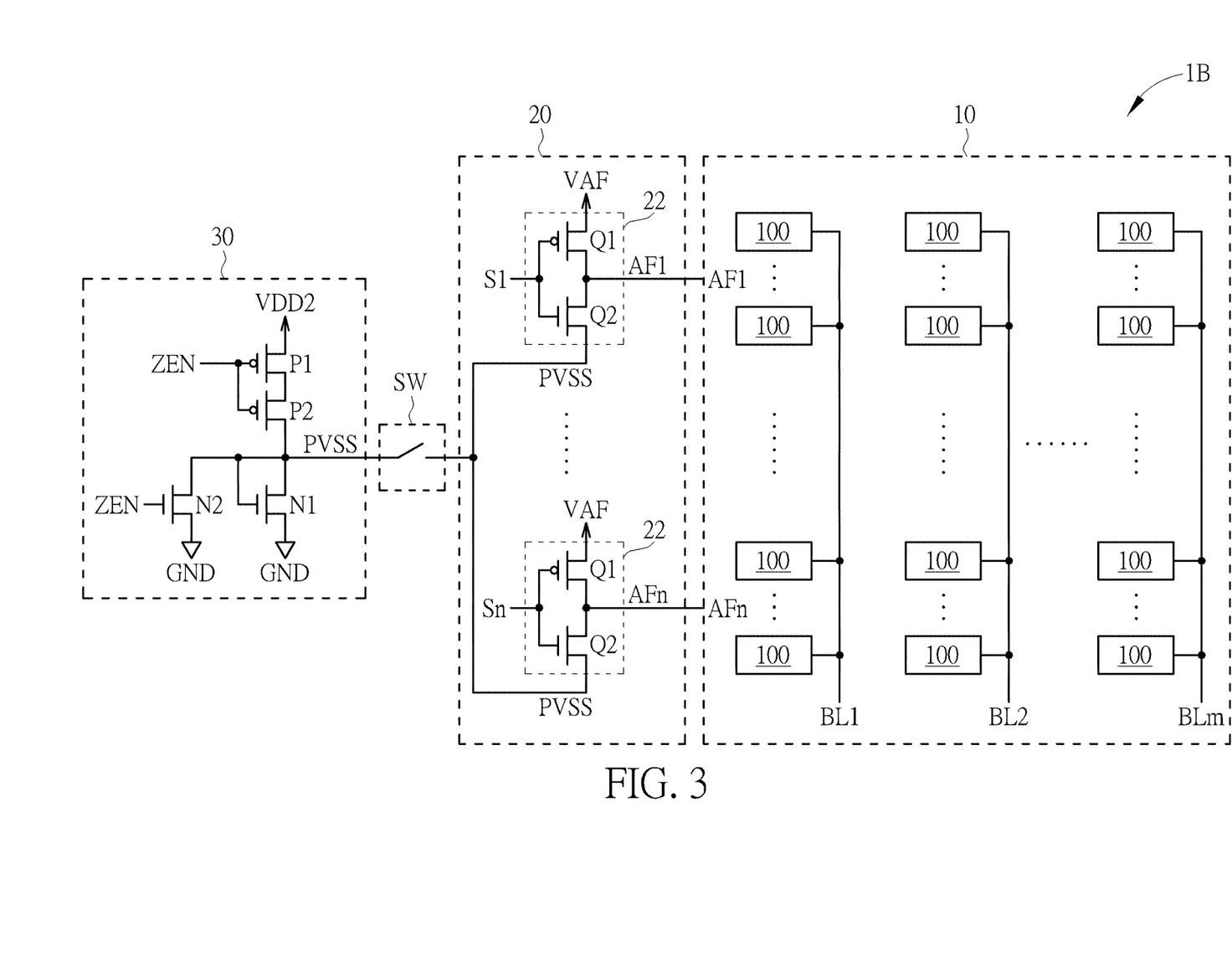
FIGS. 3 and 4 show other anti-fuse memory devices according to different embodiments of the present invention.

FIG. 3 shows another anti-fuse memory device 1B according to another embodiment of the present invention. The main difference between the anti-fuse memory devices 1 and 1B is that the anti-fuse memory device 1B further comprises a switch SW coupled between the driving circuit 20 and the pseudo-ground circuit 30. The switch SW may be turned on and turned off in associated with the operations of the memory array 10. For example, when the operation signal ZEN is low and the switch SW is turned on, the anti-fuse control lines (e.g., AF1, . . . , or AFn) of unselected anti-fuse memory cells 100 would receive the second control line voltage PVSS. When the switch SW is turned off, the anti-fuse control lines of unselected anti-fuse memory cells 100 are floating.

Figure 4:
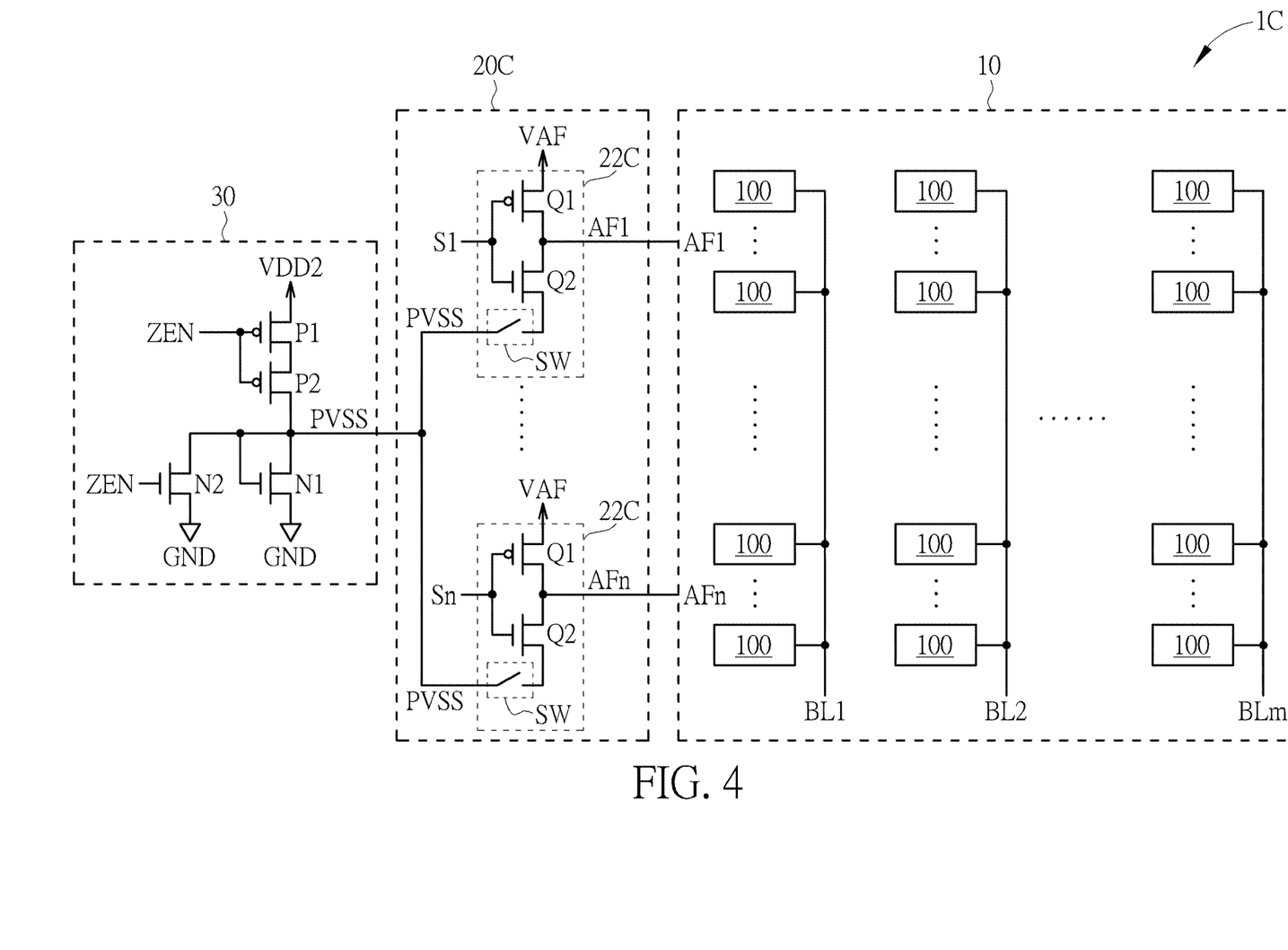

FIG. 4 shows another anti-fuse memory device 1C according to another embodiment of the present invention. The main difference between the anti-fuse memory devices 1 and 1C is that the driving circuit 20 of the anti-fuse memory device 1 shown in FIG. 1 is replaced by a driving circuit 20C of the anti-fuse memory device 1C shown in FIG. 4. The driving circuit 20C comprises a plurality of control units 22C. The control units 22C in FIG. 4 are similar with the control units 22 in FIG. 1, and the main difference between the control units 22 and 22C is that each of the control units 22C further comprises a switch SW coupled between the output terminal of the pseudo-ground circuit 30 and the second terminal of the N-type transistor Q2. The switches SW may be turned on and turned off in associated with the operations of the memory array 10. For example, when the operation signal ZEN is high and one of the switches SW is turned on, the anti-fuse control line (e.g., AF1, . . . , or AFn) coupled to the turned-on switch SW would receive the second control line voltage PVSS. When one of the switches SW is turned off, the anti-fuse control line coupled to the turned-off switch SW is floating.

In summary, when the driving circuit programs the selected anti-fuse memory cell, by floating unselected anti-fuse control lines or by applying the second control line voltage to the unselected anti-fuse control lines, voltage differences between unselected bit lines and unselected anti-fuse control lines would be eliminated or decreased to an acceptable value. Accordingly, leakage currents flowing from the unselected bit lines through the ruptured anti-fuse transistors to the unselected anti-fuse control lines would be decreased or eliminated. Since the leakage currents would be decreased or eliminated, voltage levels of the unselected bit lines would be maintained stably to keep anti-fuse transistors, which are coupled to the selected anti-fuse control line, from program disturbance. Moreover, due to the limitations of the cross-voltages of transistors, by receiving the second control line voltage PVSS instead of a ground voltage, the first control line voltage VAF may have a greater voltage level (e.g., a voltage level greater than 6V). Accordingly, the voltage difference between the bit line and the anti-fuse control line coupled to the selected anti-fuse memory cell 100 would be increased when the anti-fuse memory device performs the program operation, such that the anti-fuse memory device would have a better program efficiency.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An anti-fuse memory device, comprising:
    a plurality of anti-fuse control lines comprising a first anti-fuse control line;
    a plurality of word lines comprising a first word line;
    a plurality of bit lines comprising a first bit line; and
    a plurality of anti-fuse memory cells, each anti-fuse memory cell being coupled to a corresponding anti-fuse control line, a corresponding word line and a corresponding bit line;
    wherein when an anti-fuse memory cell of the anti-fuse memory cells is selected during a program operation of the anti-fuse memory device:
    the first anti-fuse control line coupled to the selected anti-fuse memory cell is configured to receive a first control line voltage;
    the first word line coupled to the selected anti-fuse memory cell is configured to receive a first word line voltage;
    the first bit line coupled to the selected anti-fuse memory cell is configured to receive a first bit line voltage;
    the bit lines other than the first bit line are configured to receive a second bit line voltage higher than the first bit line voltage; and
    the anti-fuse control lines other than the first anti-fuse control line are floating or are configured to receive a second control line voltage higher than the first bit line voltage, wherein the second control line voltage is equal to or less than the second bit line voltage and is higher than a ground voltage.

2. The anti-fuse memory device of claim 1, wherein during the program operation, the word lines other than the first word line are configured to receive a second word line voltage lower than the first word line voltage.

3. The anti-fuse memory device of claim 1, wherein the each anti-fuse memory cell comprises:
    an anti-fuse transistor, coupled to the corresponding anti-fuse control line; and
    a select transistor, coupled to the corresponding word line and the corresponding bit line.

4. The anti-fuse memory device of claim 3 further comprising:
    a plurality of following gate lines;
    wherein the each anti-fuse memory cell further comprises:
    a following gate transistor, coupled to a corresponding following gate line, and coupled between the anti-fuse transistor and the select transistor.

5. The anti-fuse memory device of claim 4, wherein during the program operation:
    a first following gate line of the following gate lines coupled to the selected anti-fuse memory cell is configured to receive a first following gate; and
    the following gate lines other than the first following gate line are configured to receive a second following gate voltage lower than the first following gate voltage.

6. The anti-fuse memory device of claim 1 further comprising:
    a driving circuit comprising a plurality of control units, and each control unit is configured to output the first control line voltage or the second control line voltage, according to a select signal, to one of the anti-fuse control lines, wherein the each control unit comprises:
    a P-type transistor having a first terminal applied with the first control line voltage, a second terminal coupled to the anti-fuse control line coupled to the each control unit, and a control terminal for receiving the select signal; and
    an N-type transistor having a first terminal coupled to the anti-fuse control line coupled to the each control unit, a second terminal applied with the second control line voltage, and a control terminal for receiving the select signal.

7. The anti-fuse memory device of claim 1 further comprising:
    a pseudo-ground circuit configured to output the second control line voltage, comprising:
    a first P-type transistor having a first terminal coupled to a first power terminal, a second terminal coupled to an output terminal of the pseudo-ground circuit, and a control terminal configured to receive an operation signal; and
    a first N-type transistor having a first terminal and a control terminal coupled to the output terminal of the pseudo-ground circuit, and a second terminal coupled to a second power terminal.

8. The anti-fuse memory device of claim 7, wherein the pseudo-ground circuit further comprises:

a second N-type transistor having a first terminal coupled to the output terminal of the pseudo-ground circuit, a second terminal coupled to the second power terminal, and a control terminal configured to receive the operation signal.

9. The anti-fuse memory device of claim 1 further comprising a switch coupled to the anti-fuse control lines, and configured to make the anti-fuse control lines other than the first anti-fuse control line floating during the program operation.

10. A memory array, comprising:
a first memory cell;
a second memory cell;
a third memory cell; and
a fourth memory cell;
wherein when the memory array performs a program operation and the first memory cell is selected:
a first control line coupled to the first memory cell and the second memory cell is configured to receive a first control line voltage;
a first word line coupled to the first memory cell and the second memory cell is configured to receive a first word line voltage;
a first bit line coupled to the first memory cell and the third memory cell is configured to receive a first bit line voltage;
a second control line coupled to the third memory cell and the fourth memory cell is configured to be floating or receive a second control line voltage outputted from a pseudo-ground circuit;
a second word line coupled to third memory cell and the fourth memory cell is configured to receive a second word line voltage; and
a second bit line coupled to the second memory cell and the fourth memory cell is configured to receive a second bit line voltage;
wherein the first control line voltage is higher than the second control line voltage, the first word line voltage is higher than the second word line voltage, and the first bit line voltage is lower than the second bit line voltage; and
wherein the second control line voltage is higher than a ground voltage and is lower than or equal to the second bit line voltage.

11. The memory array of claim 10, wherein the first word line voltage is lower than or equal to the second bit line voltage.

12. The memory array of claim 10, wherein the pseudo-ground circuit comprises:
a first P-type transistor having a first terminal coupled to a first power terminal, and a control terminal configured to receive an operation signal;
a second P-type transistor having a first terminal coupled to a second terminal of the first P-type transistor, a second terminal coupled to an output terminal of the pseudo-ground circuit, and a control terminal configured to receive the operation signal; and
a first N-type transistor having a first terminal coupled to the output terminal of the pseudo-ground circuit, a second terminal coupled to a second power terminal, and a control terminal coupled to the output terminal of the pseudo-ground circuit.

13. A programming method of an anti-fuse memory device, the anti-fuse memory device comprising a plurality of anti-fuse control lines, a plurality of word lines, a plurality of bit lines, a plurality of anti-fuse memory cells, a driving circuit, and a pseudo-ground circuit, each anti-fuse memory cell being coupled to a corresponding anti-fuse control line, a corresponding word line and a corresponding bit line, and the driving circuit being configured to controlling operations of the anti-fuse memory cells via the anti-fuse control lines, the word lines and the bit lines, the programming method comprising:
the driving circuit programming a selected anti-fuse memory cell selected from the anti-fuse memory cells by applying a first control line voltage to an anti-fuse control line coupled to the selected anti-fuse memory cell, applying a first word line voltage to a word line coupled to the selected anti-fuse memory cell, and applying a first bit line voltage to a bit line coupled to the selected anti-fuse memory cell;
the driving circuit applying a second bit line voltage greater than the first bit line voltage to rest bit lines when the driving circuit programs the selected anti-fuse memory cell; and
the driving circuit applying a second control line voltage to rest anti-fuse control lines or driving the rest anti-fuse control lines to a floating state when the driving circuit programs the selected anti-fuse memory cell, wherein the pseudo-ground circuit is configured to output the second control line voltage, and the second control line voltage is equal to or less than the second bit line voltage and is higher than a ground voltage.

14. The programming method of claim 13 further comprising:
the driving circuit applying a second word line voltage less than the first word line voltage to rest word lines when the driving circuit programs the selected anti-fuse memory cell.

15. The programming method of claim 13, wherein the each anti-fuse memory cell comprises:
an anti-fuse transistor, coupled to the corresponding anti-fuse control line; and
a select transistor, coupled to the corresponding word line and the corresponding bit line.

16. The programming method of claim 15, wherein the each anti-fuse memory cell further comprises:
a plurality of following gate lines;
wherein the each anti-fuse memory cell further comprises:
a following gate transistor, coupled to a corresponding following gate line, and coupled between the anti-fuse transistor and the select transistor.

17. The programming method of claim 16 further comprising:
the driving circuit applying a first following gate voltage to the corresponding following gate line when the driving circuit programs the selected anti-fuse memory cell; and
the driving circuit applying a second following gate voltage lower than the first following gate voltage to rest following gate lines when the driving circuit programs the selected anti-fuse memory cell.

18. The programming method of claim 13, wherein the driving circuit comprises a plurality of control units, and each control unit is configured to output the first control line voltage or the second control line voltage to one of the anti-fuse control lines coupled to the each control unit, according to a select signal.

19. The programming method of claim 13, wherein the pseudo-ground circuit comprises:
a first P-type transistor having a first terminal coupled to a first power terminal, and a control terminal configured to receive an operation signal;

a second P-type transistor having a first terminal coupled to a second terminal of the first P-type transistor, a second terminal coupled to an output terminal of the pseudo-ground circuit, and a control terminal configured to receive the operation signal; and a first N-type transistor having a first terminal coupled to the output terminal of the pseudo-ground circuit, a second terminal coupled to a second power terminal, and a control terminal coupled to the output terminal of the pseudo-ground circuit.

20. The programming method of claim 19, wherein the pseudo-ground circuit further comprises:

a second N-type transistor having a first terminal coupled to the output terminal of the pseudo-ground circuit, a second terminal coupled to the second power terminal, and a control terminal configured to receive the operation signal.

* * * * *